United States Patent [19]

Ponticelli, Jr.

[11] Patent Number: 4,733,748

[45] Date of Patent: Mar. 29, 1988

[54] LOUDSPEAKER MOUNTING DEVICE FOR CAR RADIO

[76] Inventor: Pasco C. Ponticelli, Jr., 7455 Owensmouth Ave., Canoga Park, Calif. 91303

[21] Appl. No.: 22,773

[22] Filed: Mar. 6, 1987

[51] Int. Cl.[4] .......................... H05K 5/00; H04R 7/22

[52] U.S. Cl. .................................... 181/141; 181/150; 181/171; 381/86; 381/193; 381/205

[58] Field of Search ............... 181/141, 148, 150, 155, 181/171, 175, 179; 248/27.3, 342-344, DIG. 6; 381/86, 193, 205

[56] References Cited

U.S. PATENT DOCUMENTS

| | | | |
|---|---|---|---|
| 3,575,370 | 4/1971 | Morris et al. | 248/27.3 X |
| 4,326,599 | 4/1982 | Thompson et al. | 181/175 |
| 4,439,643 | 3/1984 | Schweizer | 181/153 X |

*Primary Examiner*—B. R. Fuller
*Attorney, Agent, or Firm*—Edward A. Sokolski

[57] ABSTRACT

A mounting frame for a loudspeaker has a plurality of similar slots formed at each of the corners thereof. A beveled tooth is formed in one of the walls of each slot. An L-shaped bracket having longitudinal and transverse arm portions has transverse serrations formed in the outer surface of the longitudinal arm portion. One of the brackets is inserted into each slot opposite the beveled tooth thereof with the serrations ratcheting on the edge of the tooth to a selected locking position whereat the transverse arm of the bracket abuts against the speaker frame. A bendable tab extends into the slot at a portion thereof adjacent to the beveled tooth, this bendable tab operating to retain the bracket in position but when bent over enabling the sideways motion of the bracket so that it can be removed from the slot. The frame is mounted to a wall of the vehicle by means of a pair of bracket members each having a pair of arms with a surface which is serrated transversely and which engages mating teeth on a serrated leg extending outwardly from the frame, the brackets have posts extending therefrom which fit under U-shaped hangers in a wall of the vehicle to retain the frame to the wall of such vehicle.

5 Claims, 9 Drawing Figures

LOUDSPEAKER MOUNTING DEVICE FOR CAR RADIO

This invention relates to loudspeaker mounts for car radios and more particularly bracket assemblies for mounting the speaker on a frame and for mounting the frame on a wall of the vehicle.

Car radio loudspeakers are generally mounted on a wall of the vehicle either on the dashboard or in the trunk. The speaker may be mounted in a frame such as shown in my U.S. Pat. No. Des. 281,495 and U.S. Pat. No. 4,143,249. Speakers generally attach to the frame by means of bolts and nuts with the frame being attached to the vehicle wall either by means of bolts and nuts or by means of resilient hook members which are mounted on the opposite ends of the frame and which engage U-shaped lugs mounted on the vehicle wall.

The present invention provides an improvement over such prior art mounting systems by obviating the need for bolts and screws in both attaching a loudspeaker to the frame and the frame to the vehicle wall; in its place providing a simple clamping arrangement for clamping the loudspeaker to the frame in a rapid and simple operation which is considerably less time consuming than involved with the use of nuts and bolts. Further, a unique clamping arrangement is provided for securing the frame to the vehicle wall in conjunction with U-shaped lugs mounted on such wall. This clamping arrangement utilizes brackets which can be rapidly and easily installed to provide firm retention of the speaker frame to the wall. The device of the invention further provides simple means for rapidly detaching the loudspeaker from the frame if need be if replacement is required.

The improvement is achieved in the present invention by employing L-shaped brackets having serrations formed transversely in the outer surface of the longitudinal arm of the L. Slots are formed at predetermined positions around the periphery of the frame, preferably in each of the corners thereof, these slots each having a beveled tooth member therein which matingly engages the serrated wall of the bracket. In clamping the speaker to the frame, the longitudinal arms of the brackets are pressed into the slots with their serrations against the beveled tooth members and ratcheted to a position where the transverse arms of the brackets firmly engage the rim of the speaker to retain it to the frame. Hinged stop members are provided in the slots adjacent to the tooth members such that the brackets can be removed from the slots by bending the hinged members and moving the longitudinal arms of the brackets laterally into the space where the hinged members are located from where the brackets can be removed from the slots.

The frame is attached to the wall of the vehicle by means of similar bracket members having transverse serrations formed on outwardly extending arms thereof which engage similar serrated surfaces on leg portions extending from the opposite ends of the frame. The brackets have posts which extend therefrom which fit under U-shaped lugs mounted in the vehicle wall such that the brackets are held to the frame by the holding action between the interlocking mating serrated surfaces on the bracket and the frame foot portions, with the posts being held under the lugs.

It is therefore an object of this invention to provide a simple frame mount system for mounting a loudspeaker on the wall of a vehicle.

It is a further object of this invention to simplify and speed up the installation of loudspeakers in vehicles.

Other objects of the invention will become apparent as the description proceeds in connection with the accompanying drawings of which:

Figure 3:
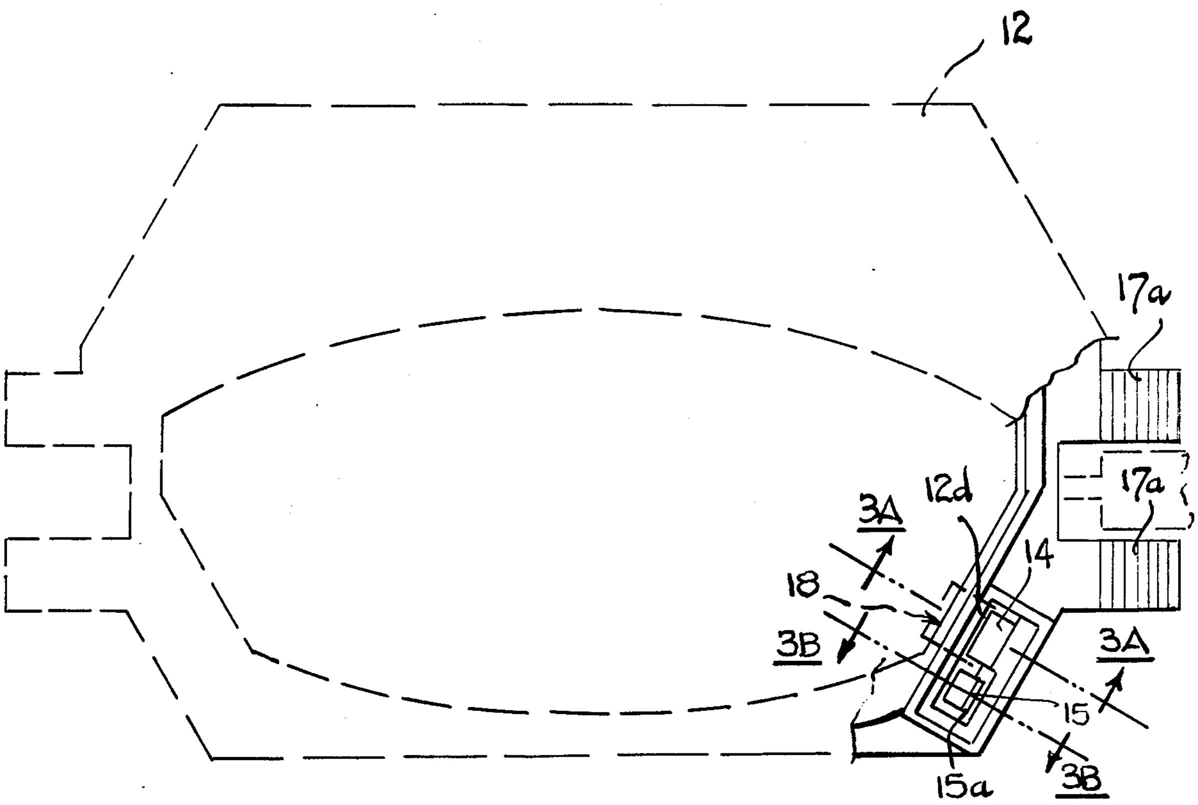
FIG. 3 is a top plan view illustrating the slotted portions of the frame of the preferred embodiment.
Figure 3A:
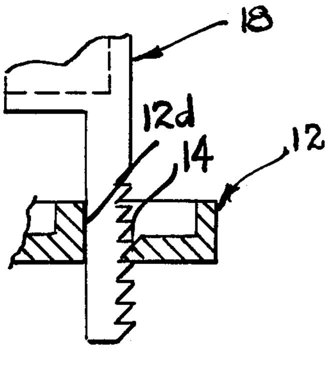
FIG. 3A is a cross sectional view taken along the plane indicated by 3A—3A in FIG. 3.

Referring now to FIGS. 1–4 a preferred embodiment of the invention is illustrated. Loudspeaker adapter frame 12 has slots **12*a*–12*d* formed in each of the four corners thereof. These slots, as best can be seen in FIGS. 3, 3A and 3B each has a beveled rigid tab or tooth member 14 extending inwardly from the outer wall of the slot. Adjacent to each such tab or tooth member is a hinged stop member 15 which also extends inwardly into the slot from the outer wall thereof. Stop member 15 is hinged where it attaches to the wall of the slot along line 15a (See FIG. 3B) so that it can be readily folded to permit removal of the speaker clamp brackets 18, as later to be pointed out in connection with FIG. 4**.

Figure 2:
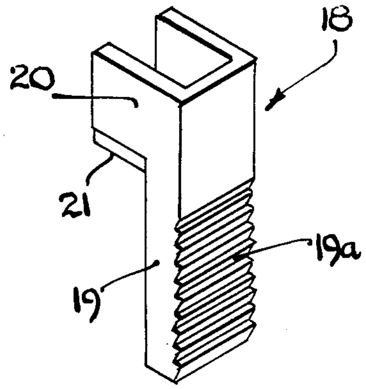
FIG. 2 is a perspective view of a bracket member of the preferred embodiment for attaching the loudspeaker to the frame.
Figure 3B:
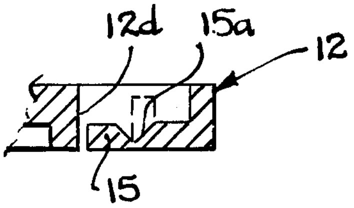
FIG. 3B is a cross sectional view taken along the plane indicated by 3B—3B in FIG. 3.

Referring to FIG. 2, the speaker clamp brackets 18 are illustrated. The clamp brackets 18 are L-shaped having a longitudinal arm portion 19 and a transverse arm portion 20 which extends normally from the longitudinal arm portion. Adhered to the inner surface of arm portion 20 is a resilient pad 21 which may be of rubber or a suitable plastic. Formed along the outer wall of longitudinal arm portion 19 are a plurality of lateral serrations **19*a*. Loudspeaker 25 is clamped to frame 12 by inserting the loudspeaker in the frame such that slots 12*a*–12*d* are directly opposite the rim of the speaker. A clamp bracket 18 is then inserted in each of slots 12*a*–12*d* opposite beveled teeth or tabs 14 and with the beveled edge of the tooth engaging serrated portion 19*a*, each bracket is pressed in position so that it ratchets on the tooth until the resilient pad 21** is in tight gripping engagement against the rim of the speaker.

Figure 4:
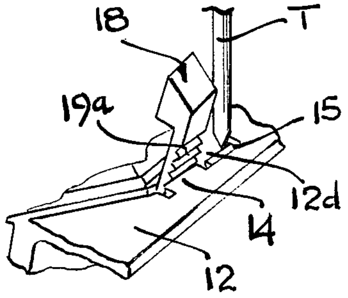
FIG. 4 is a perspective view illustrating the removal of a bracket from the speaker frame.

Referring to FIG. 4, if the loudspeaker need be removed from the adapter frame, hinged stop member 15 can be pressed inwardly by means of a tool such as a screwdriver "T" so that the bracket can be moved laterally out of engagement with tooth 14 and removed from the slot as shown in FIG. 4.

Figure 1:
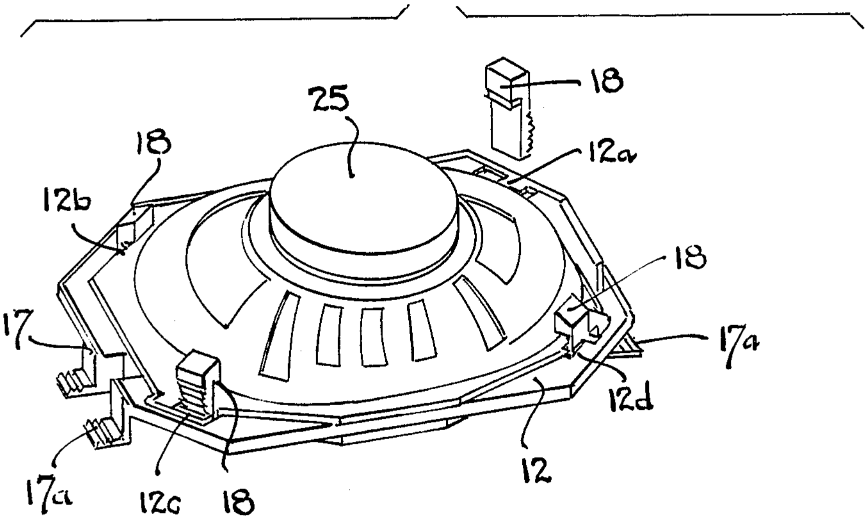
FIG. 1 is a perspective view of a preferred embodiment of the invention.
Figure 5:
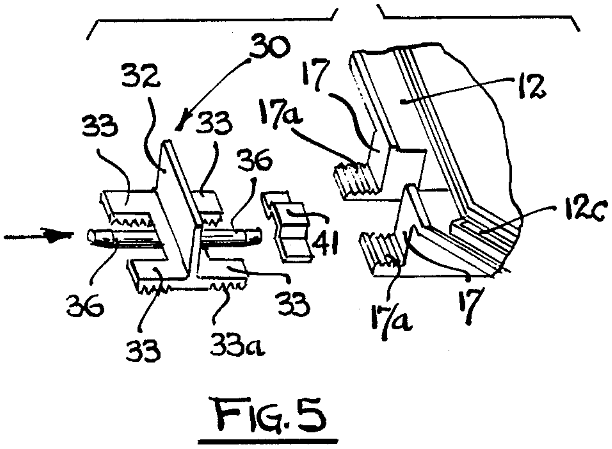
FIG. 5 is a perspective view illustrating a bracket member of the preferred embodiment for use in mounting the speaker frame to a wall of the vehicle.
Figure 5A:
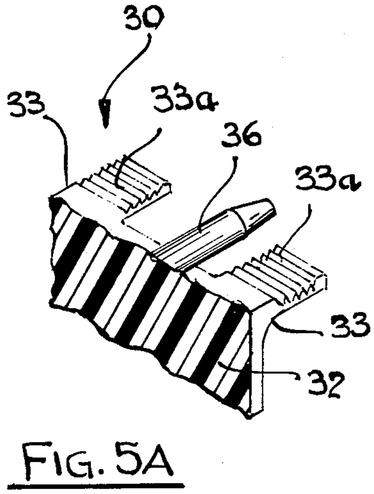
FIG. 5A is an exploded view of a bottom portion of the bracket member shown in FIG. 5.

Referring now to FIGS. 5 and 5A a clamp bracket 30 which is utilized to mount the adapter frame 12 on a wall of the vehicle is illustrated. Clamp bracket 30 has an upstanding flat wall portion 32 which can be used as a handle in installing the bracket and two pairs of oppositely extending flat arm portions 33 which run normally from wall portion 32. Extending from the wall portion between each pair of arms 33 is a post member 36. These post members have different diameters and can be used in conjunction with different size mounting hardware on the vehicle. The outer surfaces of arms 33 have transverse serrations 33*a* formed therein which mate with similar serrations 17*a* formed in legs 17 of frame 12.

Figure 6:
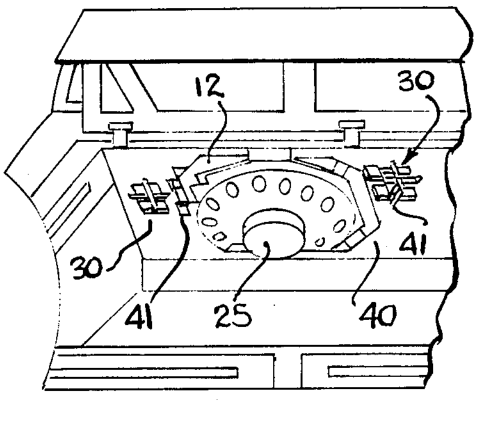
FIG. 6 is a perspective plan view illustrating the use of the bracket of FIG. 5 in mounting the speaker frame.

Referring now to FIG. 6, the mounting of the adapter frame 12 in the wall of a vehicle is illustrated. A vehicle wall 40 has U-shaped studs 41 installed therein. The mounting brackets 30 are used to mount adapter frame on the wall of the vehicle by inserting an appropriate one of pins 36 through the U-shaped lugs in snug engagement therewith then moving serrated surfaces 33*a* of the bracket against the similar serrated surfaces 17*a* of the legs 17 to effectively clamp the adapter to lugs 41. As already noted, two sets of arms 33 and pins 36 ar provided, the pins 36 being of different diameters so that the clamping bracket will be suitable for use with different size lugs 41.

While the invention has been described and illustrated in detail, it is to be clearly understood that this is intended by way of illustration and example only and is not to be taken by way of limitation, the spirit and scope of the invention being limited only by the terms of the following claims.

I claim:

1. A mounting system for use in mounting a loudspeaker having a rim on a wall of a vehicle comprising:
a loudspeaker mounting frame having a plurality of similar slots formed at predetermined positions around the periphery thereof,
each of said slots having a beveled tooth member therein,
a plurality of L-shaped brackets each of said brackets having a longitudinal arm with transverse serrations formed therein and a transverse arm,
each of said L-shaped brackets being pressed into a separate one of said slots with the serrations thereof ratcheting past the beveled tooth members to a position whereat the transverse arms of the brackets are in firm retentive engagement against the rim of the loudspeaker,
hinged stop members formed in said slots adjacent to the tooth members, said stop members being adapted to be bent to permit the L-shaped brackets to be moved sideways opposite the stop members and removed from the slots,
U-shaped lugs mounted in opposing relationship on said vehicle wall,
first and second pairs of leg portions extending outwardly from opposite ends of said frame, each of said leg portions having a transversely serrated surface, and
a second pair of brackets, each of said second pair of brackets having a flat upstanding wall portion, a pair of similar flat arms extending normally from said wall portion, the surfaces of said arms having transverse serrations formed therein, said arms being separated from each other in opposing relationship and a post extending from said wall portion between said arms,
the posts of said brackets being adapted to fit snugly under the U-shaped lugs with the serrated surfaces of the arms of said second pair of brackets in mating engagement with the serrations on corresponding leg poritons of said frame, thereby retaining the frame on the vehicle wall.

2. A mounting system for use in mounting a loudspeaker having a rim on a wall of a vehicle comprising:
a loudspeaker mounting frame having a plurality of similar slots formed at predetermined positions around the periphery thereof,
each of said slots having a beveled tooth member therein,
a plurality of L-shaped brackets, each of said brackets having a longitudinal arm with transverse serrations formed therein and a transverse arm,
each of said L-shaped brackets being pressed into one of said slots with the serrations thereof ratcheting past the beveled tooth members to a position whereat the transverse arm of each of the brackets is in firm retentive engagement against the rim of the loudspeaker,
means for facilitating the removal of said brackets from the slots comprising hinged stop members formed in the slots adjacent to the tooth members, said stop members being adapted to be bent such that the longitudinal arm of each of the brackets can be moved sideways opposite the stop members and removed from the slots, and
means for attaching the frame to the wall of the vehicle.

3. A mounting system for use in mounting a loudspeaker having a rim on a wall of a vehicle comprising:
a loudspeaker mounting frame having a plurality of similar slots formed at predetermined positions around the periphery thereof,
each of said slots having a beveled tooth member therein,
a plurality of L-shaped brackets, each of said brackets having a longitudinal arm with transverse serrations formed therein and a transverse arm,
each of said L-shaped brackets being pressed into one of said slots with the serrations thereof ratcheting past the beveled tooth members to a position whereat the transverse arm of each of the brackets is in firm retentive engagement against the rim of the loudspeaker,
resilient pad means adhered to the transverse arm of each of said L-shaped brackets for cushioning the contact between the loudspeaker rim and the L-shaped brackets,
means for facilitating the removal of said brackets from the slots, and
means for attaching the frame to the wall of the vehicle.

4. A mounting system for use in mounting a loudspeaker having a rim on a wall of a vehicle comprising:
a loudspeaker mounting frame having a plurality of similar slots formed at predetermined positions around the periphery thereof,
each of said slots having a beveled tooth member therein,
a plurality of L-shaped brackets, each of said brackets having a longitudinal arm with transverse serrations formed therein and a transverse arm,
each of said L-shaped brackets being pressed into one of said slots with the serrations thereof ratcheting past the beveled tooth members to a position whereat the transverse arm of each of the brackets is in firm retentive engagement against the rim of the loudspeaker,
means for facilitating the removal of said brackets from the slots, and means for attaching the frame to the wall of the vehicle comprising U-shaped lugs mounted on the wall of the vehicle, leg portions extending outwardly from the opposite ends of said frame, said leg portions having transverse serrations formed therein and a second pair of brackets, each of said second pair of brackets having outwardly extending arm means with transverse serrations formed therein which matingly engage the serrations of said frame leg portions and posts extending from each of said second pair of brackets which fit under the U-shaped lugs thereby retaining the frame to the vehicle wall.

5. The mounting system of claim 4 wherein said second pair of brackets each comprises a flat upstanding wall portion, said bracket arm means comprising a pair of similar oppositely positioned flat arms extending normally from said wall portion, said serrations being formed in the surfaces of said arms, there being pairs of leg portions on said frame for matingly engaging the arms of each of said pair of brackets, said posts extending from the upstanding wall portion between said arms.

* * * * *